United States Patent [19]

Arimoto et al.

[11] Patent Number: 5,048,037
[45] Date of Patent: Sep. 10, 1991

[54] SEMICONDUCTOR LASER DEVICE

[75] Inventors: Satoshi Arimoto; Toshitaka Aoyagi, both of Itami, Japan

[73] Assignee: Mitsubishi Denki Kabushiki Kaisha, Japan

[21] Appl. No.: 553,579

[22] Filed: Jul. 18, 1990

[30] Foreign Application Priority Data

Oct. 13, 1989 [JP] Japan .................. 1-267333

[51] Int. Cl.$^5$ .............................. H01S 3/19
[52] U.S. Cl. ........................ 372/45; 372/46; 357/17
[58] Field of Search ............... 372/45, 46, 43, 44; 357/17

[56] References Cited

U.S. PATENT DOCUMENTS

| 4,667,332 | 5/1987 | Mihashi et al. | 372/45 |
| 4,792,960 | 12/1988 | Yamamoto et al. | 372/46 |
| 4,841,535 | 6/1989 | Mihashi et al. | 372/46 |

FOREIGN PATENT DOCUMENTS

| 0154792 | 12/1980 | Japan | 372/46 |
| 61-280694 | 12/1986 | Japan . | |
| 62-84582 | 4/1987 | Japan . | |
| 0279690 | 12/1987 | Japan | 372/46 |
| 0135089 | 5/1989 | Japan | 372/43 |
| 0179386 | 7/1989 | Japan | 372/43 |

OTHER PUBLICATIONS

Mihashi et al., "A Novel Self-Aligned ... Mo—CVD", SOlid State Devices and Materials, Tokyo, 6-1985, pp. 63–66.

Mihashi et al., "A Novel Self-Aligned ... MOCVD", IEDM, Washington, D.C., 12-1985, pp. 646–649.

Primary Examiner—Georgia Epps
Attorney, Agent, or Firm—Leydig, Voit & Mayer

[57] ABSTRACT

A visible light semiconductor laser device of an SBA type in which a current blocking layer of a second conductivity type is disposed on a semiconductor substrate of a first conductivity type and a stripe-shaped groove current path is provided in the current blocking layer. A lower cladding structure of the first conductivity type and a GaInP active layer are sequentially epitaxially grown on the current blocking layer and in the stripe-shaped groove. The lower cladding structure includes a first cladding layer of AlGaAs disposed on the current blocking layer and in the stripe-shaped groove and a second cladding layer of AlGaInP which is sufficiently thin not to cause inferior growth of the active layer disposed on the first cladding layer.

15 Claims, 2 Drawing Sheets $Eg1 \sim 2.03\,eV$
$Eg2 \sim 2.30\,eV$
$Eg3 \sim 1.85\,eV$

SEMICONDUCTOR LASER DEVICE

FIELD OF THE INVENTION

The present invention generally relates to visible light semiconductor laser devices using materials containing AlGaInP, and more particularly, to semiconductor laser devices preventing inferior growth of AlGaInP in a groove to achieve a good SBA (Self-aligned with Bent Active layer) structure.

BACKGROUND OF THE INVENTION

FIG. 3(a) is a cross-sectional view illustrating an effective refractive index waveguide type semiconductor laser device using materials containing AlGaAs described in, for example, an article by Y. Mihashi, Y. Nagai, H. Matsubara and K. Ikeda, entitled "A Novel Self-Aligned Laser with Small Astigmatism Grown by MO-CVD", Extended Abstracts of 17th Conference on Solid State Devices and Materials, 1985, pp. 63–66. In FIG. 3(a), reference numeral 1 designates a substrate comprising p type GaAs. A p type $Al_{0.43}Ga_{0.57}As$ layer 2 having a thickness of 1 micron is disposed on the substrate 1. An n type GaAs current blocking layer 3 having a thickness of 1 micron is disposed on the p type AlGaAs layer 2. A p type $Al_{0.43}Ga_{0.57}As$ cladding layer 4 having a thickness of 1 micron is disposed on the current blocking layer 3. An undoped $Al_{0.07}Ga_{0.93}As$ active layer 5 having a thickness of 0.07 micron is disposed on the cladding layer 4. An n type $Al_{0.43}Ga_{0.57}As$ cladding layer 6 having a thickness of 1.3 micron is disposed on the active layer 5. An n type GaAs contact layer 7 having a thickness of 1 micron is disposed on the cladding layer 6. In addition, reference numeral 8 designates a stripe-shaped groove provided on the current blocking layer 3, and reference numeral 9 designates an oscillating region.

A semiconductor laser device having the structure as shown in FIG. 3(a) is generally referred to as an SBA (Self-aligned structure laser with bent active layer) laser.

Description is now made of a method of fabricating this laser. First, a p type AlGaAs layer 2 and an n type GaAs current blocking layer 3 are epitaxially grown on a (100) p type GaAs substrate 1 and then, a stripe-shaped groove 8 serving as a current path is formed on the current blocking layer 3 along the $[\overline{0}11]$ direction. Then, a p type AlGaAs cladding layer 4, an undoped AlGaAs active layer 5, an n type AlGaAs cladding layer 6, and an n type GaAs contact layer 7 are sequentially grown by MOCVD (Metal Organic Chemical Vapor Deposition). When materials containing AlGaAs are grown by MOCVD, the growth proceeds in such a manner as to maintain the shape of the stripe-shaped groove 8. Consequently, the laser structure as shown in FIG. 3(a) is achieved. This characteristics is inherent to MOCVD. In such a structure with a grown layer that is bent, current is efficiently concentrated in an oscillating region 9. Accordingly, the threshold current of laser oscillation can be reduced. In addition, the SBA laser is constructed such that the cladding layer 4 comprising p type $Al_{0.43}Ga_{0.57}$ exists on right and left sides of the active layer 5 comprising $Al_{0.07}Ga_{0.93}As$ at the oscillating region 9. Accordingly, an effective refractive index difference occurs in a lateral direction of the oscillating region 9. Consequently, the SBA laser has the advantages that a lateral mode can be stably controlled and astigmatism can be reduced.

Although the SBA laser has the above-described advantages, the same structure is achieved by materials containing AlGaInP as shown in FIG. 3(b). In FIG. 3(b), reference numeral 10 designates a p type AlGaInP cladding layer having a thickness of 0.8 to 1 micron, reference numeral 11 designates a GaInP active layer having a thickness of 0.07 micron, and reference numeral 12 designates an n type AlGaInP cladding layer having a thickness of 0.8 to 1 micron. Thus, when a stripe-shaped groove is buried by growing materials containing AlGaInP, abnormal growth occurs. Consequently, a good SBA laser structure such as that using materials containing AlGaAs can not be achieved using materials containing AlGaInP.

The conventional semiconductor laser device is constructed as described above. Accordingly, the semiconductor laser device has the disadvantage in that it is difficult to achieve the above-described good SBA structure using the materials containing AlGaInP.

SUMMARY OF THE INVENTION

An object of the present invention is to overcome the difficulty in burying a groove by making growth with materials containing AlGaInP to provide a semiconductor laser device comprising materials containing AlGaInP having a good SBA structure.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a semiconductor laser device includes a cladding structure disposed on a current blocking layer having a stripe-shaped groove current path to bury the strip-shaped groove comprising a two-layer structure including a first cladding layer comprising AlGaAs disposed on the current blocking layer and the stripe-shaped groove, and a second cladding layer comprising AlGaInP which is sufficiently thin not to cause inferior growth of the active layer and disposed on the first cladding layer.

Therefore, the thickness of the second cladding layer comprising AlGaInP can be reduced in burying a groove by mainly growing the first cladding layer comprising AlGaAs, so that inferior growth in the groove can be restrained to obtain a good SBA structure using materials containing AlGaInP.

DETAILED DESCRIPTION OF THE PREFERRED EMBODIMENTS

An embodiment of the present invention will be described in detail with reference to the drawings.

Figure 1:
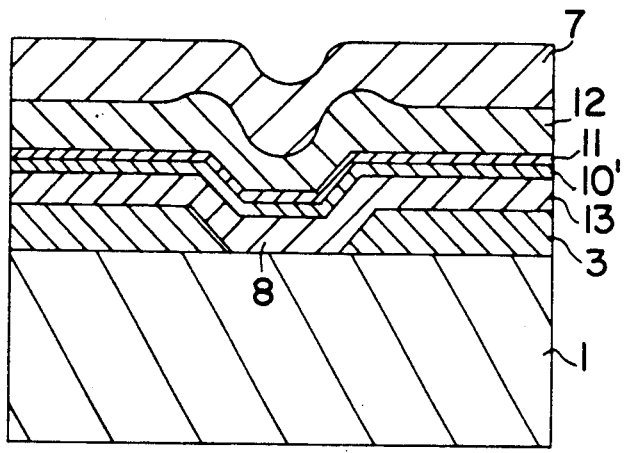
FIG. 1 is a cross-sectional view showing a structure of a semiconductor laser device according to an embodiment of the present invention.

FIG. 1 is a cross-sectional view illustrating a semiconductor laser device according to an embodiment of the present invention.

In FIG. 1, reference numeral 1 designates a p type GaAs substrate. An n type GaAs current blocking layer 3 having a thickness of 1 micron is disposed on the substrate 1. A p type $Al_{0.8}Ga_{0.2}As$ cladding layer 13 having a thickness of approximately 0.6 to 1 micron is disposed on the current blocking layer 3. A p type $(Al_{0.6}Ga_{0.4})_{0.5}In_{0.5}P$ cladding layer 10' having a thickness of approximately 0.1 to 0.2 micron is disposed on the cladding layer 13. A $Ga_{0.5}In_{0.5}P$ active layer 11 having a thickness of 0.07 micron is disposed on the cladding layer 10'. An n type $(Al_{0.6}Ga_{0.4})_{0.5}In_{0.5}P$ cladding layer 12 having a thickness of 0.8 to 1 micron is disposed on the active layer 11. An n type GaAs contact layer 7 having a thickness of 1 micron is disposed on the cladding layer 12. In addition, reference numeral 8 designates a stripe-shaped groove provided on the current blocking layer 3.

A production process will be described in the following.

First, an n type GaAs layer 3 having a thickness of approximately 1 micron is epitaxially grown on a (100) p type GaAs substrate 1 and then, a stripe-shaped groove 8 serving as a current path is formed by etching in the [01$\bar{1}$] or [011] direction as shown in FIG. 1. Thereafter, a p type $Al_{0.8}Ga_{0.2}As$ cladding layer 13, a p type $(Al_{0.6}Ga_{0.4})_{0.5}In_{0.5}P$ cladding layer 10', a $Ga_{0.5}In_{0.5}P$ active layer 11, an n type $(Al_{0.6}Ga_{0.4})_{0.5}In_{0.5}P$ cladding layer 12, and an n type GaAs contact layer 7 are sequentially epitaxially grown by MOCVD.

Figure 3A:
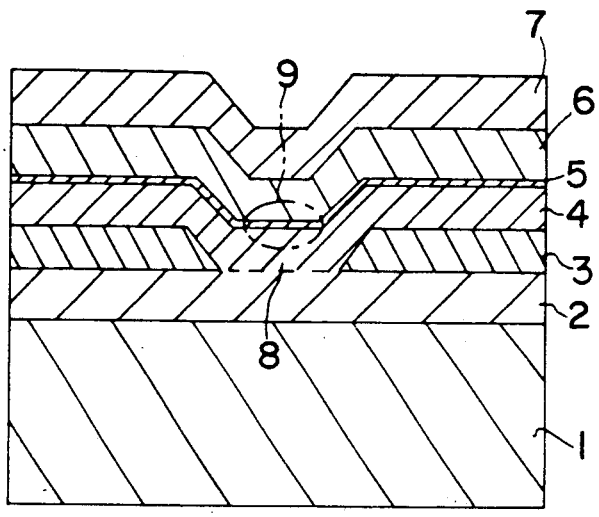
FIGS. 3(a) and 3(b) are cross-sectional views showing structures of prior art semiconductor laser devices.
Figure 3B:
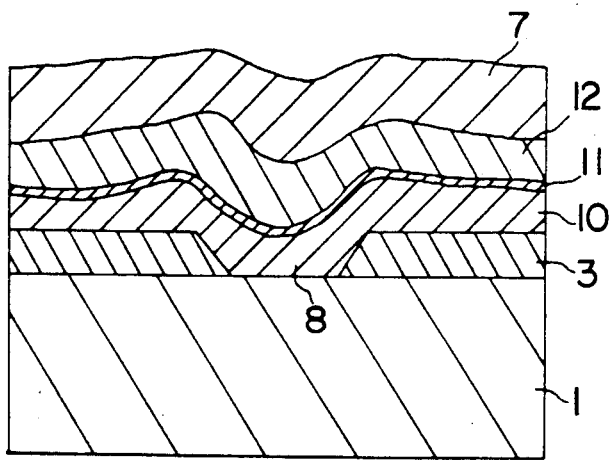

In this embodiment, the p type AlGaAs layer 13 first p type cladding layer is set to approximately 0.6 to 1 micron thick, and the p type AlGaInP layer 10' second p type cladding layer is approximately 0.1 to 0.2 micron thick. When the stripe-shaped groove 8 is buried by making growth of materials containing AlGaInP, inferior growth as shown in FIG. 3(b) occurs. However, the inferior growth can be significantly reduced by controlling the thicknesses of the layers to the above-described values. More specifically, inferior growth of a portion, particularly the active layer 11, is prevented by making the total thickness of the p type AlGaInP layer 10', the GaInP active layer 11, and the n type AlGaInP cladding layer 12 to approximately 1 micron.

A description is now made of the composition of each of the layers for achieving a laser structure. When $Ga_{0.5}In_{0.5}P$ lattice matched with GaAs is used as the active layer 11, the band gap energy thereof is approximately 1.85 eV. The band gap energy of a cladding layer must be larger than this value. When AlGaInP is used as the cladding layer, it is desirable to use $(Al_{x1}Ga_{1-x1})_{0.5}In_{0.5}P$ having an aluminum composition $x_1$ of at least 0.5 or more (the band gap energy thereof is 2.2 eV or more) so as to restrain degradation of temperature characteristics of the laser caused by the overflow of carriers injected into the active layer 11. In addition, in order to prevent the light generated at the active layer 11 from significantly leaking the cladding layer, the refractive index of the p type AlGaAs layer 13 must be smaller than that of $Ga_{0.5}In_{0.5}P$ and must be smaller than that of the p type AlGaInP layer 10'. The laser oscillation wavelength of the $Ga_{0.5}In_{0.5}P$ active layer 11 is 670 to 680 nm (approximately 1.85 eV when it is converted into energy). The refractive index of $Ga_{0.5}In_{0.5}P$ for this wavelength is approximately 3.6. Consequently, as the laser structure, the compositions of $Al_{x2}Ga_{1-x2}As$ and $(Al_{x1}Ga_{1-x1})_{0.5}In_{0.5}P$ may be suitably combined with each other such that the refractive index of $Ga_{0.5}In_{0.5}P$
> the refractive index of $(Al_{x1}Ga_{1-x1})_{0.5}In_{0.5}P$
> the refractive index of $Al_{x2}Ga_{1-x2}As$ on a condition that the refractive index of $Al_{x2}Ga_{1-x2}As$ is in the range of 3.1 ($x_2=1$) to 3.3 ($x_2=0.7$) when $0.7 \leq x_2 \leq 1$, and the refractive index of $(Al_{x1}Ga_{1-x1})_{0.5}In_{0.5}P$ is in the range of 3.2 ($x_1=1$) to 3.4 ($x_1=0.5$) when $0.5 \leq x_1 \leq 1$. Meanwhile, the band gap energy of AlGaAs is in the range of 2.0 ($x_2=0.7$) to 2.2 ($x_2=1$) eV and the band gap energy of AlGaInP is 2.2 ($x_1=0.5$) to 2.35 ($x_1=1$) eV.

Figure 2A:
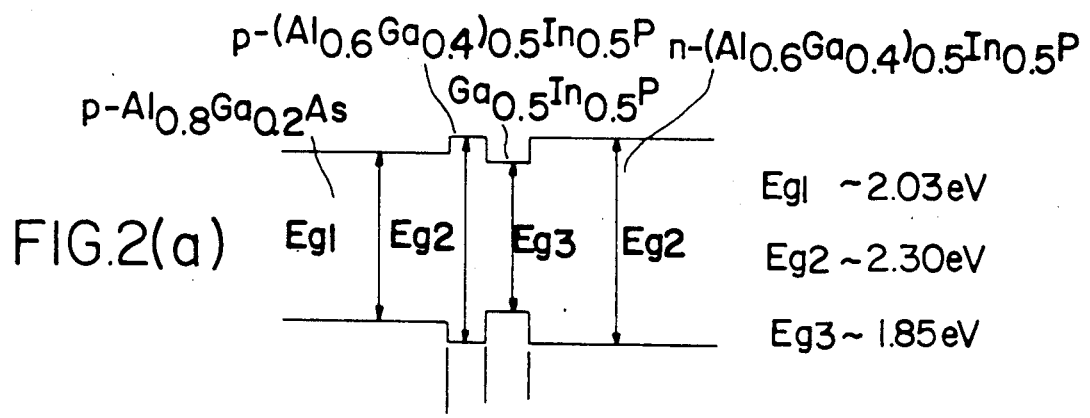
FIGS. 2(a) and 2(b) are diagrams respectively showing the energy band structure and the refractive index distribution of the semiconductor laser device according to an embodiment of the present invention.
Figure 2B:
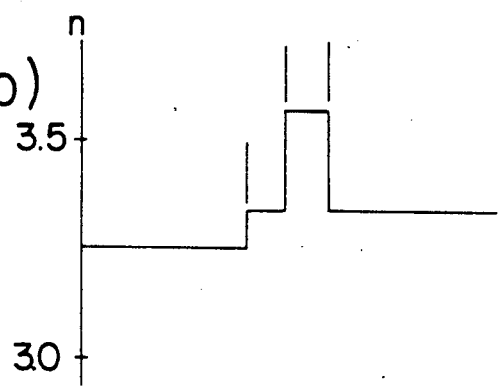

FIGS. 2(a) and 2(b) are diagrams showing the energy band structure and the refractive index distribution in a case where the laser structure shown in FIG. 1 is achieved using AlGaInP in the case of $x_1=0.6$ and AlGaAs in the case of $x_2=0.8$ by way of example.

As can be seen from FIGS. 2(a) and 2(b), the active layer 11 has the highest refractive index and the cladding layers 12 and 10' on its upper and lower sides have the refractive indices lower than that of the active layer 11, and the cladding layer 13 has a refractive index lower than that of the cladding layer 10'. Accordingly, high efficiency light confinement in the thickness direction of the layers is obtained.

As described above, in the present embodiment, a lower cladding layer burying a stripe-shaped groove current path and disposed on a current blocking layer has a two-layer structure including a first cladding layer comprising AlGaAs disposed on the current blocking layer and the stripe-shaped groove and a second cladding layer comprising AlGaInP, sufficiently thin not to cause inferior growth, disposed on the first cladding layer. By thus restraining inferior growth of AlGaInP in the groove, a good SBA structure can e obtained even using materials containing AlGaInP.

As is evident from the foregoing description, according to the present invention, in a SBA type semiconductor laser device having a lower cladding layer and a GaInP active layer sequentially formed burying a stripe-shaped groove a current path and disposed on a current blocking layer, the cladding layer comprises a two-layer structure including a first cladding layer comprising AlGaAs disposed on the current blocking layer and in the stripe-shaped groove and a second cladding layer comprising AlGaInP sufficiently thin not to cause inferior growth disposed on the first cladding layer. Accordingly, the inferior growth of materials containing AlGaInP in the groove is significantly reduced. Consequently, a visible light semiconductor laser device of an SBA type using materials containing AlGaInP is obtained.

What is claimed is:

1. A self-aligned bent active layer semiconductor laser for emitting visible light comprising:
   a semiconductor substrate of a first conductivity type;
   a semiconductor current blocking layer of a second conductivity type opposite the first conductivity type disposed on said substrate including a central stripe-shaped groove exposing the substrate;
   a lower cladding layer of the first conductivity type and an active layer comprising GaInP successively disposed on said current blocking layer and in said stripe-shaped groove, said lower cladding layer comprising a first cladding layer comprising AlGaAs disposed on said current blocking layer and in said stripe-shaped groove on said substrate and a second cladding layer comprising AlGaInP sufficiently thin to avoid inferior growth thereon of said GaInP active layer; and a third semiconductor cladding layer of the second conductivity type disposed on said active layer.

2. A semiconductor laser as defined in claim 1 wherein said substrate and said current blocking layer comprise GaAs.

3. A semiconductor laser as defined in claim 1 wherein the band gap of said first cladding layer comprising AlGaAs is wider than that of said active layer comprising GaInP and the refractive index of said first cladding layer at the laser oscillation wavelength is smaller than that of said second cladding layer comprising AlGaInP for the laser oscillation wavelength.

4. A semiconductor laser as defined in claim 1 wherein said third cladding layer comprises AlGaInP.

5. A semiconductor laser device comprising:
a substrate comprising p type GaAs:
a current blocking layer comprising n type GaAs disposed on said substrate and having a central stripe-shaped groove current path at which said substrate is exposed;
a first cladding layer comprising p type AlGaAs disposed on said current blocking layer and said substrate where exposed in the stripe-shaped groove;
a second cladding layer comprising p type AlGaInP disposed on said first cladding layer and sufficiently thin not to cause inferior growth of GaInP thereon;
an active layer comprising GaInP disposed on said second cladding layer; and
a third cladding layer comprising n type AlGaInP disposed on said active layer.

6. A semiconductor laser device as defined in claim 5 wherein said first cladding layer, said second cladding layer, said active layer, and said third cladding layer are grown by the metal organic chemical vapor deposition method.

7. A semiconductor laser device as defined in claim 5 wherein said active layer comprises $Ga_{0.5}In_{0.5}P$.

8. A semiconductor laser device as defined in claim 7 wherein the aluminum composition ratio of said second cladding layer and of said third cladding layer is at least 0.25.

9. A semiconductor laser device as defined in claim 8 wherein the band gap of said first cladding layer is wider than that of said active layer.

10. A semiconductor laser device as defined in claim 9 wherein said first cladding layer comprises p type $Al_{0.8}Ga_{0.2}As$, and said second cladding layer comprises p type $(Al_{0.6}Ga_{0.4})_{0.5}In_{0.5}P$.

11. A semiconductor laser device as defined in claim 7 wherein said first cladding layer comprises $Al_{x2}Ga_{1-x2}As$ and said second cladding layer comprises $(Al_{x1})_{0.5}In_{0.5}P$ where $x_1 \geq 0.5$ and $1 \geq x_2 \geq 0.7$.

12. A semiconductor laser device as defined in claim 5 wherein the total thicknesses of the second cladding, active, and third cladding layers do not exceed one micron.

13. A semiconductor laser device as defined in claim 1 wherein the total thicknesses of the second cladding, active, and third cladding layers do not exceed on micron.

14. A semiconductor laser device as defined in claim 5 wherein said second cladding layer is about 0.1 to about 0.2 microns thick.

15. A semiconductor laser device as defined in claim 1 wherein said second cladding layer is about 0.1 to about 0.2 micron thick.

* * * * *

UNITED STATES PATENT AND TRADEMARK OFFICE
CERTIFICATE OF CORRECTION

PATENT NO. : 5,048,037

DATED : September 10, 1991

INVENTOR(S) : Arimoto et al

It is certified that error appears in the above-identified patent and that said Letters Patent is hereby corrected as shown below:

Column 5, line 15, change "for" to --at--.

Column 6, line 21, change "$(Al_{x1})_{0.5}In_{0.5}P$" to --$(Al_{x1}Ga_{1-x1})_{0.5}In_{0.5}P$--.

Signed and Sealed this

Ninth Day of March, 1993

Attest:

STEPHEN G. KUNIN

Attesting Officer

Acting Commissioner of Patents and Trademarks